United States Patent
Arnold et al.

(10) Patent No.: US 7,256,969 B1
(45) Date of Patent: Aug. 14, 2007

(54) DISCRETE STEP STABILIZATION OF NARROW-TRACK AMR READ SENSORS

(75) Inventors: Carl Stephen Arnold, Golden, CO (US); Edward Virgil Denison, Erie, CO (US); Carl Anthony Helms, Lafayette, CO (US); Stein Klevdal, Niwot, CO (US); Kevin D. McKinstry, Arvada, CO (US); Mark Lee Watson, Louisville, CO (US)

(73) Assignee: Storage Technology Corporation, Louisville, CO (US)

( * ) Notice: Subject to any disclaimer, the term of this patent is extended or adjusted under 35 U.S.C. 154(b) by 534 days.

(21) Appl. No.: 10/862,287

(22) Filed: Jun. 7, 2004

(51) Int. Cl.
*G11B 5/127* (2006.01)

(52) U.S. Cl. .................................. 360/313

(58) Field of Classification Search ............ 360/313, 360/324, 110, 328, 324.1, 324.11, 324.2, 360/324.12
See application file for complete search history.

(56) References Cited

U.S. PATENT DOCUMENTS

| | | | | |
|---|---|---|---|---|
| 4,556,925 A | * | 12/1985 | Suenaga et al. | ............ 360/327 |
| 5,745,978 A | * | 5/1998 | Aboaf et al. | ............. 29/603.08 |
| 5,784,224 A | * | 7/1998 | Rottmayer et al. | ......... 360/324 |
| 6,111,722 A | * | 8/2000 | Fukuzawa et al. | ..... 360/324.12 |
| 6,731,475 B2 | * | 5/2004 | Ikeda | ......................... 360/322 |
| 7,139,156 B1 | * | 11/2006 | Helms et al. | .......... 360/327.11 |

* cited by examiner

*Primary Examiner*—Allen Cao
(74) *Attorney, Agent, or Firm*—Brooks Kushman P.C.

(57) ABSTRACT

A method and system are provided for implementing discrete step stabilization of AMR read sensors in tape or disk drives. In one implementation, a plurality of discrete step stabilizers and AMR read sensor elements are arranged with a rotational symmetry coupled with a plane inversion for an odd number of steps, and no inversion for an even number of steps. Preferably, the steps are oriented at 45 degrees, or approximately parallel to the desired bias direction. For relatively narrow track widths (e.g., approximately 5 microns), the edges of the sensor element nearest the permanent magnets are especially important to stabilize. Therefore, in one implementation, an edge of a stabilizer preferably intersects the edge of the sensor element at one half of the stripe height. Also, the rising and falling edges of the stabilizers do not always have the same slope. In order to compensate for the different slopes of a stabilizer's edges, the rising and falling edges of a stabilizer's pattern are interchanged by a "stabilizer phase" transformation to produce the complement (phase conjugate) of the stabilizer pattern. As such, if a single rising edge of a stabilizer pattern intersects the center of a sensor element, the "stabilizer phase" transformation changes this structure to a single falling edge that intersects the center of the sensor element.

19 Claims, 3 Drawing Sheets

FIG. 3

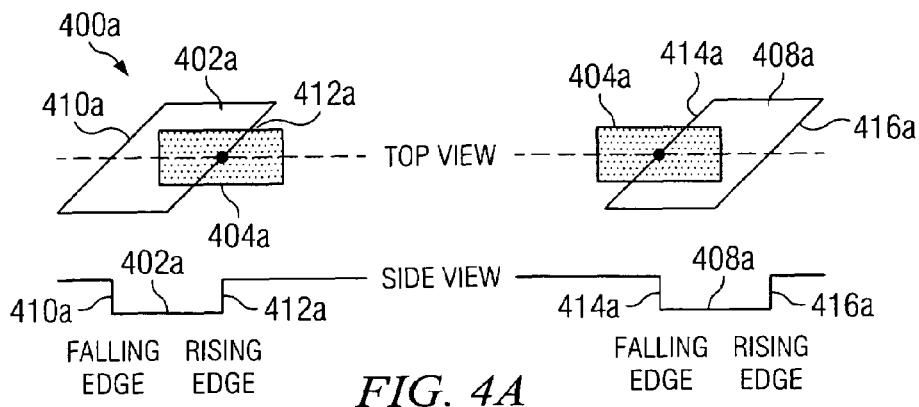
*FIG. 4A*
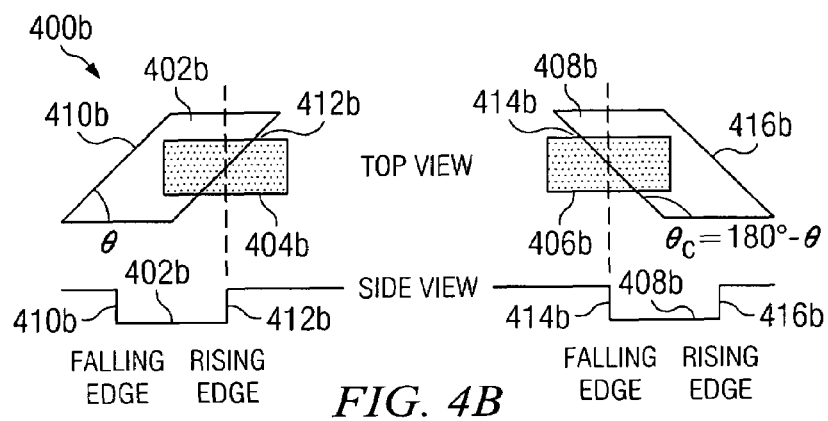
*FIG. 4B*
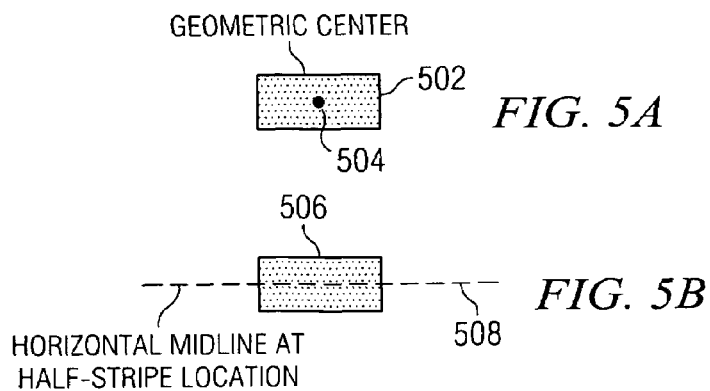
*FIG. 5A*
*FIG. 5B*
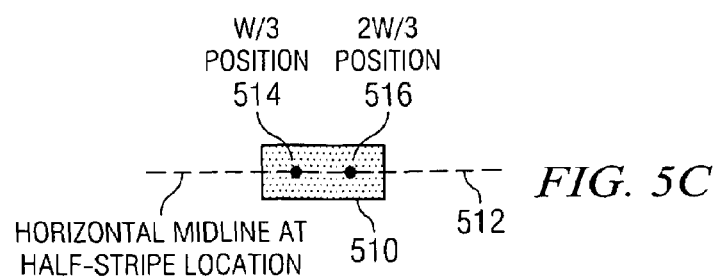
*FIG. 5C*

DISCRETE STEP STABILIZATION OF NARROW-TRACK AMR READ SENSORS

RELATED APPLICATIONS

The present application is related by subject matter to commonly assigned U.S. Pat. No. 7,139,156 entitled "NON-PENETRATION OF PERIODIC STRUCTURE TO PM", filed on Jun. 20, 2002, and hereby incorporated by reference.

BACKGROUND OF THE INVENTION

1. Field of the Invention

The present invention relates generally to improved data storage technology, and in particular, but not exclusively, to a method and system for implementing discrete step stabilization of narrow-track, Anisotropic Magneto-Resistive (AMR) read sensors in magnetic media storage systems.

2. Background of the Invention

Tape drives are peripheral mass storage devices often used to archive data on tapes for later access. In certain applications, huge amounts of data are stored directly on magnetic tape for later retrieval and analysis. Tape drives are also used as random access devices in data storage applications where the cost of storage is more important than access time.

Data can be stored or written onto a magnetic media (tape or disk) by selectively magnetizing regions of the media with a write head. The magnetized regions of the media produce a magnetic field that can be detected and converted into an electrical signal by a read head. A common type of read head used for carrying out this conversion is an AMR read head.

More precisely, the operation of reading data from the magnetic media is performed by sensing the magnetic polarity transitions on the media as it is moved across a read head in a longitudinal direction. The magnetic transitions on the media present a varying magnetic field to a read transducer in the read head. The read transducer converts the magnetic field into an analog read signal that is delivered to a read channel for processing. The read channel converts this analog signal into one or more digital signals that are processed by a computer system.

In thin-film heads including a plurality of transducer elements, AMR sensors are often used to read information from the magnetic media, because of the increased sensitivity of the AMR sensors during read operations. During a read operation, an AMR sensor is held very near a disk or in contact with a tape, in order to sense the varying magnetic transitions on a particular track. A constant DC (bias) current is passed through the AMR sensor, and the sensed varying magnetic transitions produce a variable voltage across the sensor due to its varying resistance. This variable voltage signal is the read analog signal, which is then processed and converted to digital form.

A common goal in the information storage industry is to magnetically stabilize AMR read elements so that the generated electrical signals are linear. This goal is frequently accomplished by controlling the boundary or end magnetic domains in the read sensors involved. In the past, this boundary magnetic control was provided by permanent magnets or magnetic exchange tabs attached to the ends of the sensors. However, the greater the width of the track containing the stored data, the less effective boundary magnetic control was at the center of the read sensor.

One technique used to overcome this limitation has been to form a periodic perturbation (grating structure) which creates a periodic magnetic charge that stabilizes the middle region of the sensor. However, the resulting periodic perturbation can interfere with the magnetic field of the permanent magnet(s). This interference problem is exacerbated as the read heads are made smaller.

An improved magnetic stabilization technique for MR read heads is described and claimed in related U.S. Pat. No. 7,139,156 entitled "NON-PENETRATION OF PERIODIC STRUCTURE TO PM". This technique limits the undulations of the periodic grating structure used for magnetic stabilization of an MR read sensor to regions that are not directly adjacent to the permanent magnets attached at either end of the sensor. This technique allows the permanent magnets to stabilize the magnetization near the ends of the sensor, and also allows the periodic structure to stabilize the magnetization in the middle region of the sensor without perturbing the permanent magnets.

Nevertheless, a significant problem that has arisen is that read sensors are being made narrower while the pitch of the periodic structures is constrained. For example, in one of the narrowest track sensors currently being produced, only a single stabilizer centered on the sensor is used. Consequently, it is no longer tenable to regard such a structure as periodic.

In actual fact the parts of a stabilizer that influence magnetic behavior are the steps located beneath the sensor (e.g., depressions precisely milled typically in an Aluminum Oxide/Alumina ($Al_2O_3$) underlayer directly beneath the sensor). Therefore, it is desirable to have an improved method and system for implementing discrete step stabilization of AMR read sensors including, for example, narrow-track, AMR read sensors.

SUMMARY OF THE INVENTION

The present invention provides a method and system for implementing discrete step stabilization of AMR read sensors including, for example, narrow-track, AMR read sensors in tape drives. In a preferred embodiment of the present invention, a plurality of discrete-step stabilizers and AMR read sensor elements are arranged as shown in FIG. 3. Preferably, the steps of the stabilizers are oriented at 45 degrees, or approximately parallel to the desired bias direction. For relatively narrow track widths (e.g., approximately 5 microns), the edges of the sensor element nearest the permanent magnets are especially important to stabilize. Therefore, in one embodiment, an edge of a stabilizer preferably intersects the edge of the sensor element at one half of the stripe height. Also, the rising and falling edges of the stabilizers do not always have the same slope. Therefore, in one embodiment, to compensate for the different slopes of a stabilizer's edges, the rising and falling edges of a stabilizer's pattern are interchanged by a "stabilizer phase" transformation to produce the complement (phase conjugate) of the stabilizer pattern, as shown in FIG. 3. As such, if a single rising edge of a stabilizer pattern intersects the center of a sensor element, the "stabilizer phase" transformation changes this structure to a single falling edge that intersects the center of the sensor element.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 3 depicts a diagram that illustrates a plurality of discrete step stabilization patterns for an AMR read head, which may be used to implement one or more preferred embodiment(s) of the present invention;

FIGS. 4A and 4B are related diagrams depicting exemplary phase shift (P), reflection (R), and combined reflection and phase shift transformation operations, respectively, that can be performed in accordance with a preferred embodiment of the present invention; and FIGS. 5A-5C are related diagrams depicting geometric features associated with AMR read sensor elements, which are structured in accordance with a preferred embodiment of the present invention.

DETAILED DESCRIPTION OF THE PREFERRED EMBODIMENT

Figure 1:
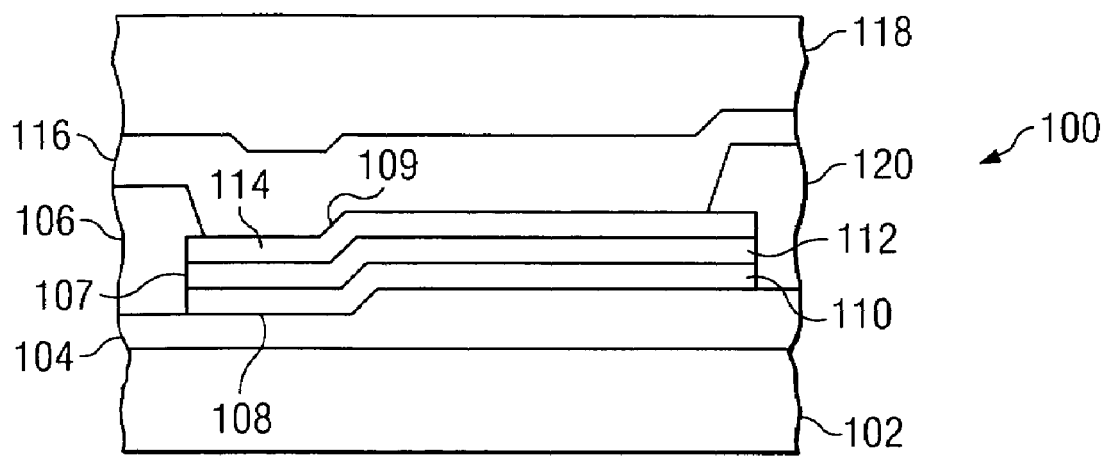
FIG. 1 depicts a cutaway view of an AMR read head with a single step stabilizer, which may be used to implement a preferred embodiment of the present invention.

With reference now to the figures and in particular with reference to FIG. 1, a cutaway view of an exemplary AMR read head is depicted, which may be used to implement a preferred embodiment of the present invention. Although the following structural description includes particular dimensions and materials, this information is provided for illustrative purposes only and not intended as architectural limitations to be imposed on the present invention.

The exemplary cutaway view of AMR read head 100 shows magnetic shields 102 and 118. Typically, magnetic shields 102, 118 are highly permeable magnetic shields that help to focus the magnetic fields emanating from a disk or tape and eliminate stray fields. In a preferred embodiment, each magnetic shield 102, 118 is made from a Cobalt-Zirconium Tantalum alloy (CZT) and is approximately 2.5 microns thick. Although not explicitly shown in this cutaway, side view of AMR read head 100, magnetic shields 102, 118 cover substantially the bottom and top surfaces, respectively, of AMR read head 100.

First gap layer 104 is formed directly above bottom magnetic shield 102. Preferably, for this exemplary embodiment, first gap layer 104 is made of Aluminum Oxide/Alumina ($Al_2O_3$) and is approximately 1100 Angstroms thick. First gap layer 104 forms a substrate upon which AMR read sensor element 107 can be formed. Also, permanent magnets 106, 120 can be placed on first gap layer 104 at each end of AMR read sensor element 107 thus formed.

Exemplary AMR read sensor element 107 is shown formed with layers 110, 112, 114. Layer 110 is preferably formed from a Cobalt Zirconium Molybdenum (CZM) alloy and is approximately 250 Angstroms thick. An important function of layer 110 is to create a magnetic field in the MR layer (e.g., layer 114 in this embodiment), which allows a quasi-linear magnetic field-(from the storage medium)-to-voltage device operation to occur.

Layer 112 is formed directly on layer 110. Layer 112 is preferably made from Tantalum and is approximately 80 Angstroms thick. An important function of layer 112 is as a spacer layer to prevent direct contact between magnetic layer 110 and (MR) layer 114. Layer 114 is preferably composed of a Nickel Iron alloy and is approximately 320 Angstroms thick. Layer 114 creates an MR response that converts detected magnetic field changes to resistance and/or voltage changes.

Second gap layer 116 is formed on (MR) layer 114. Second gap layer 116 is preferably composed of Aluminum Oxide/Alumina similar to that of first gap layer 104 and is approximately 1500 Angstroms thick. Second gap layer 116 covers both MR sensor element 107 and permanent magnets 120. Magnetic shield 118 is formed on second gap layer 116. As mentioned earlier, magnetic shields 118 and 102 function primarily to block stray magnetic fields.

As illustrated by FIG. 1, MR sensor element 107 is not entirely planar shaped. For this exemplary embodiment, a single step (109) is shown. Note that the cutaway view of FIG. 1 is at the tape-bearing surface, which is half a stripe height below the horizontal midline (as described in more detail below). Therefore, for this example, step 109 occurs to the left-of-center of MR sensor element 107. Also, note that all structures formed above first gap layer 104 to the left side of step 109 are lower than on the right side of step 109. As such, the discrete step topography of MR sensor element 107 can be formed by known photolithographic and/or iron milling techniques.

Figure 2:
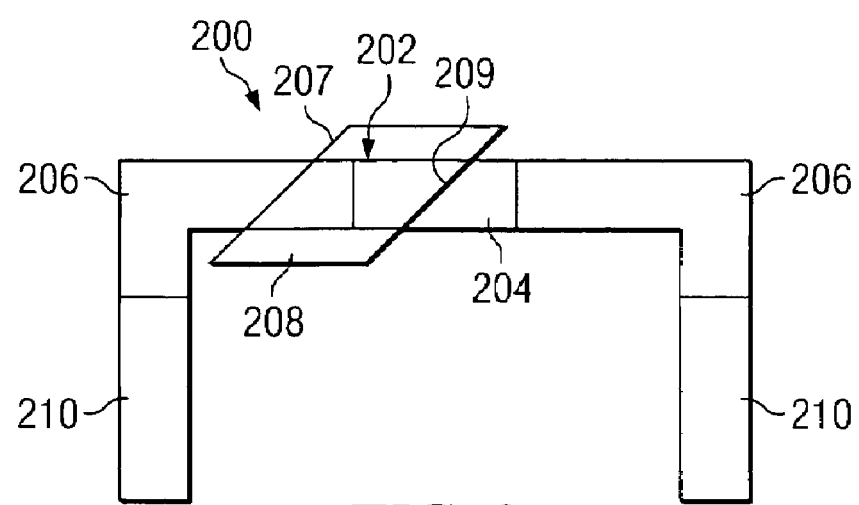
FIG. 2 depicts a planar view of an AMR read head structure in accordance with a preferred embodiment of the present invention.

FIG. 2 depicts a planar view of an AMR read head structure in accordance with a preferred embodiment of the present invention. AMR read head 200 is shown with the magnetic shields removed for clarity. For this exemplary embodiment, tape-bearing surface 202 is part of MR region 204. Permanent magnets 206 abut MR region 204 at respective junctions. High conductivity leads 210 provide power to AMR read head 200. Note, for this illustrative example, that step 207 of stabilizer 208 penetrates into one of permanent magnets 206. Also, note that only one step (209) of stabilizer 208 passes through the read sensor element (MR region 204) of AMR read head 200. Step 209 intersects the geometric center of AMR read head 200 in this example.

Figure 3:
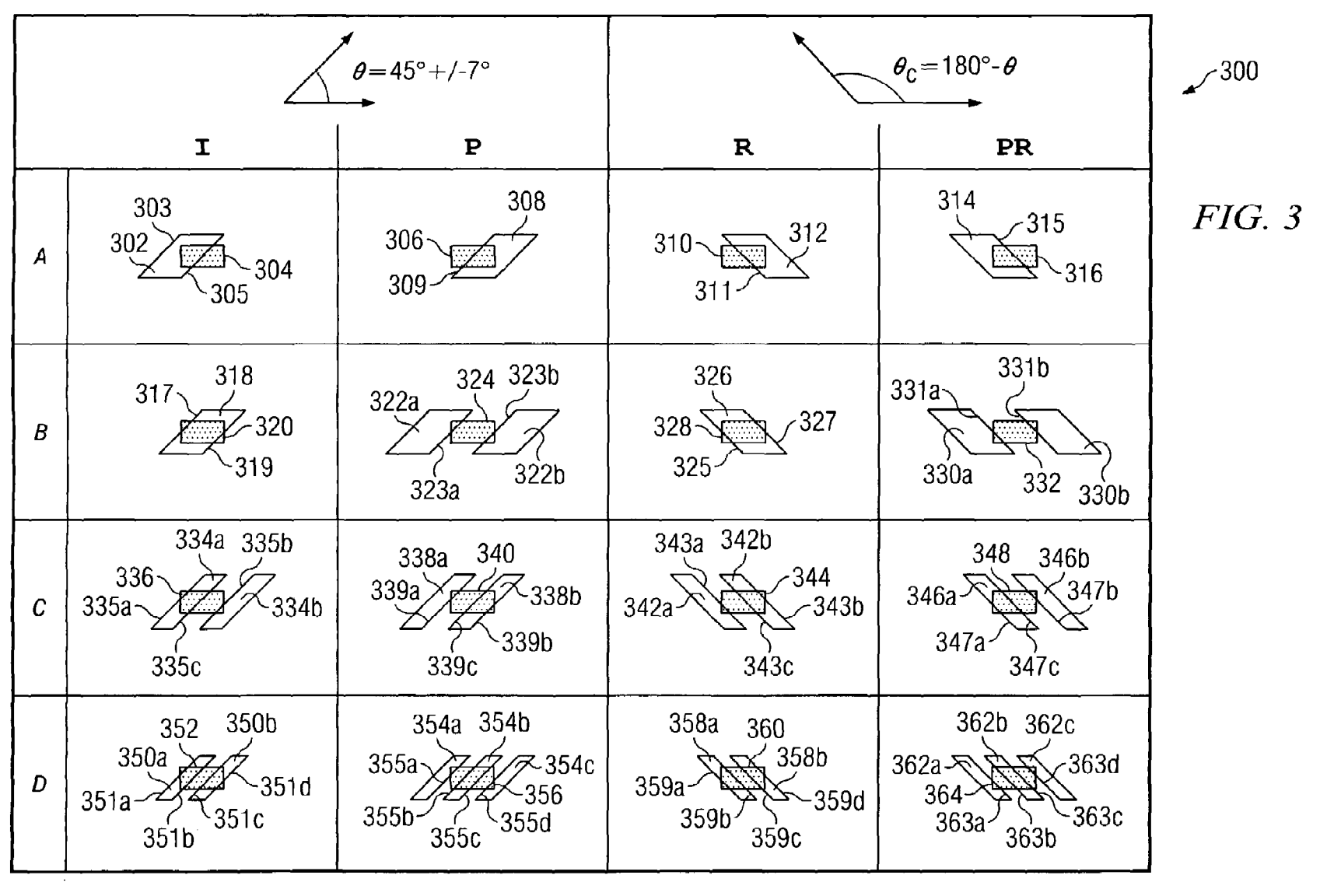

FIG. 3 depicts a diagram that illustrates a plurality of discrete step stabilization patterns for an AMR read head, which may be used to implement one or more preferred embodiment(s) of the present invention. For example, the plurality of stabilizer patterns 300 can be implemented with AMR read head 100 shown in FIG. 1 and/or AMR read head 200 shown in FIG. 2. Notably, as readily seen from the drawings, step stabilizer 208 and MR region 204 in FIG. 2 are respectively illustrated by the pattern (IA) of discrete step 302 and AMR sensor element 304 in FIG. 3.

For clarity, the exemplary plurality of stabilizer patterns (300) illustrated in FIG. 3 is shown as 16 stabilizer patterns. However, the present invention is not intended to be limited to a specific number of patterns, and the number and type of patterns shown are not to be considered architectural limitations on the present invention. As such, in each stabilizer pattern shown, the shaded rectangle (e.g., element 304) represents an AMR sensor element, and the parallelogram (e.g., element 302) represents a depression (e.g., precisely milled) under the sensor element, whose edges (e.g., elements 303, 305) form discrete step structures.

Alternatively, instead of a depression with at least one rising edge and one falling edge, each stabilizer pattern may be an elevated area with at least one rising edge and one falling edge. Thus, instead of milling out a "hole" to form a depression in a layer of material under the sensor element, the material around the stabilizer pattern can be milled out to form an elevated area under the sensor element.

The operations I, P, R and PR in FIG. 3 represent transformations that can be applied to the basic stabilizer patterns A, B, C and D. Essentially, for this exemplary embodiment, "I" represents an identity operation that leaves the basic pattern unchanged. Also, as described in detail below, "P" represents a phase shift operation that transforms a rising/falling edge of a step structure to a falling/rising edge of that structure. "R" represents a reflection operation that transforms a step structure of a basic pattern to a mirror image of that step structure about its midpoint. "PR" represents a combination of phase shift and reflection operations that first transforms a basic pattern according to the R operation, and then phase shifts that pattern according to the P operation.

Specifically, with reference to FIGS. 4A and 4B, related diagrams depicting exemplary phase shift (P) and reflection (R) transformation operations, respectively, that can be performed in accordance with a preferred embodiment of the present invention, are shown for illustrative purposes. Referring now to FIG. 4A, a diagram depicting an exemplary phase shift (P) transformation operation 400a is shown. In this case, the P transformation interchanges the location where the falling and rising edges of a stabilizer intersect the horizontal midline of the pattern at the center of the sensor element. In other words, the P transformation is a phase shift of a grating (stabilizer) structure such that the rising and falling edges (discrete steps) of the grating structure are interchanged.

For example, the leftmost pattern in FIG. 4A (e.g., I or identity pattern) includes stabilizer 402a with falling edge 410a and rising edge 412a. In this example, rising edge 412a is shown intersecting the midline (e.g., denoted by the dashed line) of the pattern at the geometric center of sensor element 404a. The P transformation (resulting in the rightmost pattern in FIG. 4A) shifts the I pattern to cause falling edge 410a to intersect the midline of the pattern at the geometric center of sensor element 404a.

Referring now to FIG. 4B, a diagram depicting an exemplary reflection (R) transformation operation 400b is shown. In this case, the R transformation also interchanges the location where the falling and rising edges of a stabilizer intersect the horizontal midline of the pattern at the center of the sensor element. However, the R transformation rotates the grating (stabilizer) structure 180 degrees about the midpoint of the sensor element such that the rising and falling edges (discrete steps) of the grating structure are interchanged.

For example, the leftmost pattern in FIG. 4B (e.g., I or identity pattern) includes stabilizer 402b with falling edge 410b and rising edge 412b. Again, similar to the I operation in FIG. 4A, rising edge 412b is shown intersecting the midline (e.g., denoted by the dashed line) of the pattern at the geometric center of sensor element 404b. The R transformation (resulting in the rightmost pattern in FIG. 4B) changes the skew of stabilizer 402b such that the angle, $\theta$, is transformed to its complementary angle, $\theta_c=180°-\theta$, as illustrated in the rightmost diagram of FIG. 4B. Also, the R transformation interchanges the rising and falling edges where they intersect the midline of the pattern at the geometric center of sensor element 404b. In this example, the I operation in the leftmost pattern in FIG. 4B shows rising edge 412b intersecting the midline of the pattern at the geometric center of sensor element 404b. The R transformation operation in the rightmost pattern in FIG. 4B also shows rising edge 412b intersecting the midline of the pattern at the geometric center of sensor element 404b, because the R transformation produces the mirror image of the I operation.

FIGS. 5A-5C are related diagrams provided for clarity and definition purposes that depict geometric features associated with AMR read sensor elements, which are structured in accordance with a preferred embodiment of the present invention. Referring to FIG. 5A, read sensor element 502 is shown with a rectangular shape and its geometric center indicated at 504. In FIG. 5B, read sensor element 506 is shown with its horizontal midline indicated at 508 located at half the stripe height. In FIG. 5C, read sensor element 510 is shown with its horizontal midline indicated at 512 located at half the stripe height. Also, FIG. 5C shows w/3 (e.g., ⅓ width) and 2w/3 (e.g., ⅔ width) positions 514 and 516, respectively, on horizontal midline 512 of read sensor element 510.

Returning now to FIG. 3, when reference is made to rising or falling steps, it should be understood that movements with respect to these structural features are viewed with the convention that the midline of a sensor is being traversed from left to right. Also, for the exemplary embodiments shown, the angle, $\theta$, is preferably equal to 45°+/−70°, and the angle, $\theta_c$, is preferably equal to 180°−$\theta$.

The basic pattern, A (i.e., IA), in FIG. 3 includes stabilizer 302 with falling step 303 and rising step 305. As shown, for this exemplary design, rising step 305 is inclined at an angle, $\theta$, and intersects the geometric center of read sensor element 304. The phase shift transformation (PA) of basic pattern, A, includes stabilizer 308 with falling step 309 inclined at an angle, $\theta$, and intersecting the geometric center of read sensor element 306. The reflection transformation (RA) of basic pattern, A, includes stabilizer 312 with falling step 311 inclined at an angle, $\theta_c$, and intersecting the geometric center of read sensor element 310. The phase shift/reflection transformation (PRA) of basic pattern, A, includes stabilizer 314 with falling step 315 inclined at an angle, $\theta_c$, and intersecting the geometric center of read sensor element 316.

The basic pattern, B (i.e., IB), in FIG. 3 includes stabilizer 318 with falling step 317 and rising step 319. As shown, for this exemplary design, falling step 317 and rising step 319 are inclined at an angle, $\theta$, and both steps intersect the left and right edges of read sensor element 320 at its horizontal midline (e.g., half-stripe height). The phase shift transformation (PB) of basic pattern, B, includes two stabilizers (322a, 322b) with both rising step 323a of stabilizer 322a and falling step 323b of stabilizer 322b inclined at an angle, $\theta$, and intersecting the left and right edges, respectively, of read sensor element 324 at its horizontal midline (e.g., half-stripe height). The reflection transformation (RB) of basic pattern, B, includes stabilizer 326 with falling step 325 and rising step 327 inclined at an angle, $\theta_c$, and intersecting the left and right edges, respectively of read sensor element 328 at its horizontal midline (e.g., half-strip height). The phase shift/reflection transformation (PRB) of basic pattern, B, includes two stabilizers (330a, 330b) with rising step 331a and falling step 331b inclined at an angle, $\theta_c$, and intersecting the left and right edges, respectively, of read sensor element 332 at its horizontal midline (e.g., half-stripe height).

The basic pattern, C (i.e., IC), in FIG. 3 includes two stabilizers 334a, 334b. As shown, for this exemplary design, stabilizer 334a includes falling step 335a and rising step 335c, and stabilizer 334b includes falling step 335b, which are all inclined at an angle, $\theta$. Falling steps 335a and 335b intersect the left and right edges of read sensor element 336 at its horizontal midline (e.g., half-stripe height), and rising step 335c intersects the geometric center of read sensor element 336. The phase shift transformation (PC) of basic pattern, C, includes two stabilizers 338a, 338b with rising step 339a of stabilizer 338a, and falling step 339c and rising step 339b of stabilizer 338b all inclined at an angle, $\theta$. Rising steps 339a and 339b intersect the left and right edges, respectively, of read sensor element 340 at its horizontal midline (e.g., half-stripe height), and falling step 339c intersects the geometric center of read sensor element 340. The reflection transformation (RC) of basic pattern, C, includes two stabilizers 342a, 342b with rising step 343a of stabilizer 342a, and falling step 343c and rising step 343b of stabilizer 342b all inclined at an angle, $\theta_c$. Rising steps 343a and 343b intersect the left and right edges, respectively of read sensor element 344 at its horizontal midline (e.g., half-strip height), and falling step 343c intersects the geometric center of read sensor element 344. The phase shift/reflection transformation (PRC) of basic pattern, C, includes two stabilizers 346a, 346b with falling step 347a and rising step 347c of stabilizer 346a, and falling step 347b of stabilizer 346b all inclined at an angle, $\theta_c$. Falling steps 347a and 347b intersect the left and right edges, respectively of read sensor element 348 at its horizontal midline (e.g., half-strip height), and rising step 347c intersects the geometric center of read sensor element 348.

The basic pattern, D (i.e., ID), in FIG. 3 includes two stabilizers, stabilizers 350a and 350b. As shown, for this exemplary design, stabilizer 350a includes falling step 351a and rising step 351b, and stabilizer 350b includes falling step 351c and rising step 351d, which are all inclined at an angle, $\theta$. Falling step 351a and rising step 351d intersect the left and right edges of read sensor element 352 at its horizontal midline (e.g., half-stripe height). Rising step 351b and falling step 351c intersect the w/3 and 2w/3 positions, respectively, of read sensor element 352 at its horizontal midline. The phase shift transformation (PD) of basic pattern, D, includes three stabilizers 354a, 354b and 354c. Rising step 355a of stabilizer 354a, falling step 355b and rising step 355c of stabilizer 354b, and falling step 355d of stabilizer 354c are all inclined at an angle, $\theta$. Rising step 355a and falling step 355d intersect the left and right edges, respectively, of read sensor element 356 at its horizontal midline (e.g., half-stripe height). Falling step 355b and rising step 355c intersect the w/3 and 2w/3 positions, respectively, of read sensor element 356 at its horizontal midline. The reflection transformation (RD) of basic pattern, D, includes two stabilizers 358a and 358b. Falling step 359a and rising step 359b of stabilizer 358a, and falling step 359c and rising step 359d of stabilizer 358b are all inclined at an angle, $\theta_c$. Falling step 359a and rising step 359d intersect the left and right edges, respectively of read sensor element 360 at its horizontal midline (e.g., half-strip height). Rising step 359b and falling step 359c intersect the w/3 and 2w/3 positions, respectively, of read sensor element 360 at its horizontal midline. The phase shift/reflection transformation (PRD) of basic pattern, D, includes three stabilizers 362a, 362b and 362c. Rising step 363a of stabilizer 362a, falling step 363b and rising step 363c of stabilizer 363b, and falling step 363d of stabilizer 362c are all inclined at an angle, $\theta_c$. Rising step 363a and falling step 363d intersect the left and right edges, respectively of read sensor element 364 at its horizontal midline (e.g., half-strip height). Falling step 363b and rising step 363c intersect the w/3 and 2w/3 positions, respectively, of read sensor element 364 at its horizontal midline.

It is important to note that while the present invention has been described in the context of a fully functioning magnetic media data storage system, those of ordinary skill in the art will appreciate that the processes and transformations of the present invention are capable of being distributed in the form of a computer readable medium of instructions and a variety of forms and that the present invention applies equally regardless of the particular type of signal bearing media actually used to carry out the distribution. Examples of computer readable media include recordable-type media such a floppy disc, a hard disk drive, a RAM, CD-ROMs, and transmission-type media such as digital and analog communications links.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A read head for magnetic media storage, comprising:
   a magnetoresistive sensor element formed on a substrate, at least one surface of said magnetoresistive sensor element including at least one of a rising step stabilization region and/or a falling step stabilization region; and
   a first magnetic element formed at a first end of said magnetoresistive sensor element, said first magnetic element encroaching on said at least one of a rising step stabilization region and/or a falling step stabilization region;
   wherein said at least one of a rising step stabilization region and/or a falling step stabilization region further comprises a magnetic stabilizer formed as a depression in said substrate, said depression including a falling edge and a rising edge.

2. The read head of claim 1, further comprising:
   a second magnetic element formed at a second end of said magnetoresistive sensor element, said second magnetic element encroaching on said at least one of a rising step stabilization region and/or a falling step stabilization region.

3. The read head of claim 1, wherein said magnetoresistive sensor element comprises an anisotropic magnetoresistive sensor element.

4. The read head of claim 2, wherein said first magnetic element and said second magnetic element comprise at least one permanent magnet.

5. The read head of claim 1, wherein said first magnetic element comprises a magnetic exchange tab.

6. The read head of claim 1, wherein said magnetic stabilizer further comprises a plurality of magnetic stabilizers formed as a plurality of depressions in said substrate, each depression of said plurality of depressions including a falling edge and a rising edge.

7. A method for discrete-step stabilization of a magnetoresistive read sensor, comprising the steps of:
   forming a magnetoresistive sensor element on a substrate, at least one surface of said magnetoresistive sensor element including at least one of a rising step stabilization region and/or a falling step stabilization region;
   forming a first magnetic element at a first end of said magnetoresistive sensor element, said first magnetic element encroaching on said at least one of a rising step stabilization region and/or a falling step stabilization region; and
   forming said at least one of a rising step stabilization region and a falling step stabilization region as a depression in said substrate said depression including a falling edge and a rising edge.

8. The method of claim 7, further comprising the steps of:
forming a second magnetic element at a second end of said magnetoresistive sensor element, said second magnetic element encroaching on said at least one of a rising step stabilization region and/or a falling step stabilization region.

9. The method of claim 7, wherein said magnetoresistive sensor element comprises an anisotropic magnetoresistive sensor element.

10. The method of claim 8, wherein said first magnetic element and said second magnetic element comprise at least one permanent magnet.

11. The method of claim 7, wherein said first magnetic element comprises a magnetic exchange tab.

12. The method of claim 7, further comprising the step of:
forming said at least one of a rising step stabilization region and a falling step stabilization region into a plurality of depressions in said substrate, each depression of said plurality of depressions including a falling edge and a rising edge.

13. The method of claim 7, further comprising the step of:
performing a reflection transformation on said at least one of a rising step stabilization region and/or a falling step stabilization region.

14. The method of claim 7, further comprising the step of:
performing a reflection transformation on said at least one of a rising step stabilization region and/or a falling step stabilization region; and
performing a phase shift transformation on said least one of a rising step stabilization region and/or a falling step stabilization region.

15. The method of claim 13, wherein said reflection transformation comprises changing an angular orientation of a step stabilizer to a complement of said angular orientation of said step stabilizer.

16. The method of claim 13, further comprising the step of:
performing a phase shift transformation on said at least one of a rising step stabilization region and/or a falling step stabilization region.

17. A method for discrete-step stabilization of a magnetoresistive read sensor, comprising the steps of:
forming a magnetoresistive sensor element on a substrate at least one surface of said magnetoresistive sensor element including at least one of a rising step stabilization region and/or a falling step stabilization region;
forming a first magnetic element at a first end of said magnetoresistive sensor element, said first magnetic element encroaching on said at least one of a rising step stabilization region and/or a falling step stabilization region; and
performing a phase shift transformation on said at least one of a rising step stabilization region and/or a falling step stabilization region.

18. The method of claim 17, wherein said phase shift transformation comprises interchanging a location of a rising edge of a step stabilizer with a falling edge of said step stabilizer.

19. The method of claim 17, further comprising the step of:
performing a reflection transformation on said at least one of a rising step stabilization region and/or a falling step stabilization region.

* * * * *